United States Patent

[11] 3,615,981

[72] Inventors Charles R. Pratt, Jr.;
Stewart G. Stalnecker, Jr., Raleigh, N.C.;
Walter H. Tarcza, Painted Post, N.Y.
[21] Appl. No. 456,616
[22] Filed May 18, 1965
[45] Patented Oct. 26, 1971
[73] Assignee Corning Glass Works
Corning, N.Y.

[54] METHOD OF MANUFACTURING ELECTRICAL CAPACITORS
4 Claims, 7 Drawing Figs.

[52] U.S. Cl. .......... 156/89, 29/25.42, 264/62
[51] Int. Cl. .......... C04b 33/34
[50] Field of Search .......... 29/25.42; 317/258, 261; 156/89; 264/56, 62; 117/217

[56] References Cited
UNITED STATES PATENTS
3,093,593 6/1963 Arrance .......... 264/62 X
2,390,025 11/1945 Deyrup et al. .......... 156/89 X
3,200,326 8/1965 Pritikin et al. .......... 317/258 X

*Primary Examiner*—Harold Ansher
*Assistant Examiner*—Henry F. Epstein
*Attorneys*—Clarence R. Patty, Jr. and Walter S. Zebrowski

ABSTRACT: A method of making electrical capacitors fused to a substrate and suitable for integration with a microcircuit comprising applying to the substrate in the order named a first buffer layer and a capacitor unit including a first capacitor plate, dielectric layer, and second capacitor plate. The assembly so formed is then fired to volatilize any organic constituents, fuse adjoining layers and plates to each other and to the adjoining portions of the substrate, and at least partially crystallize the buffer and dielectric layers. Thereafter, a second buffer layer and a layer of vitreous glazing material is applied over the capacitor unit and the assembly is fired again to volatilize any organic constituents, complete crystallization of the first buffer and dielectric layers, crystallize the second buffer layer, and fuse the newly applied layers to adjoining layers, to the adjoining exposed surface of the outer capacitor plate, and to the adjoining portions of the substrate.

INVENTORS
Charles R Pratt, Jr
Stewart G. Stalnecker, Jr
BY Walter H. Tarcza

ATTORNEY

METHOD OF MANUFACTURING ELECTRICAL CAPACITORS

It is an object of the present invention to form an economic, hermetically sealed, nonpolar capacitor suitable for integrating into a microcircuit, the components and materials of which capacitor are physically and chemically compatible with each other and the substrate on which the capacitor is formed.

Another object of this invention is to form an electrical capacitor wherein the change of capacitance thereof resulting from voltage change is maintained at a minimum.

According to the present invention a microcircuit type capacitor is formed by applying a first capacitor plate of finely divided metal, a fritted and at least partly crystallizable vitreous dielectric layer, and a second capacitor plate of finely divided metal to a first buffer layer on a nonconductive substrate, the buffer layer being composed of fritted, vitreous, nonconducting material having a coefficient of thermal expansion compatible with said dielectric layer. The assembly so formed is fired to volatilize any organic constituents, to fuse the various layers together and to the substrate, and to at least partly crystallize the dielectric and first buffer layers. A second buffer layer of fritted vitreous nonconducting material is applied to the exposed surface of second capacitor plate. A glaze frit is applied over the unit so formed so that a portion of each capacitor plate is exposed permitting electrical connection thereto. The second buffer layer is formed of material which is at least partly crystallizable and chemically compatible with the glaze and the capacitor plate materials. The unit is thereafter fired again to complete crystallization of the dielectric and first buffer layers and crystallize the second buffer layer to the extent these layers are crystallizable, and to fuse the glaze material forming a hermetically sealed, nonpolar microcircuit-type capacitor.

By compatible coefficient of thermal expansion is meant that the coefficient of expansion of one of the materials involved is the same or sufficiently close to the other material so that the stresses induced in the materials upon cooling, resulting from the difference between the coefficients, is negligible.

By nonpolar is meant that the capacitor will have the same capacitance value when the polarity of the electrical energy at the capacitor terminals is reversed.

Additional objects, features, and advantages of the present invention will become apparent to those skilled in the art, from the following detailed description and the attached drawing on which, by way of example, only the preferred embodiment of this invention is illustrated.

Figure 1:
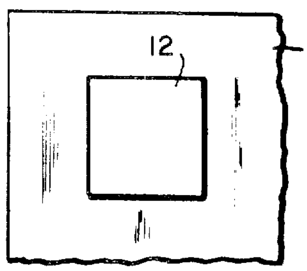
FIGS. 1–6 are fragmentary plan view of various stages of capacitor manufacture illustrating the various steps of the present invention.

Referring now to FIG. 1, there is shown a flat substrate 10, suitable for forming microcircuits thereon, with a first buffer layer 12 applied to one flat surface thereof. Examples of suitable substrate materials are glass, ceramics, glass ceramics, glazed ceramics, or the like. Glazed alumina is particularly suitable for this purpose. The buffer layer is formed having an overall shape and size somewhat larger than the size of the ultimate capacitor plates.

Figure 2:
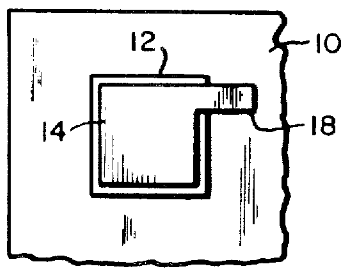

A film of finely divided metal is applied over buffer layer 12 to form first capacitor plate 14, as shown in FIG. 2. The material of the plate is prepared as a viscous mixture or paste of finely divided metallic powder and an organic vehicle, such as for example, pine oil or oil of lavender.

Figure 3:
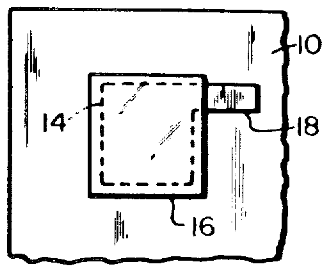

A dielectric layer 16 is applied over plate 14 so that only plate terminal 18 is exposed as shown in FIG. 3. The material of the dielectric layer is prepared as a viscous mixture or paste of fritted, at least partly crystallizable, vitreous, dielectric material and an organic vehicle, such as for example, pine oil, or oil of lavender. Suitable dielectric materials are illustrated by the compositions of examples 86 and 88 of copending application by A. Herczog and S. D. Stookey, Ser. No. 378,468 filed June 26, 1964, now Pat. No. 3,195,030 and the compositions shown in table I herein.

TABLE I

| | 1 | 2 | 3 | 4 | 5 |
|---|---|---|---|---|---|
| BaO | 20 | 18 | 15 | 11 | 39 |
| PbO | 34 | 22 | 21 | 18 | 10 |
| SrO | 3 | 2 | 10 | 9 | — |
| $Nb_2O_5$ | 30 | 45 | 40 | 50 | 40 |
| $SiO_2$ | 8 | 7 | 7 | 7 | 5 |
| $Al_2O_3$ | 2 | 4 | 4 | 2 | 2 |
| $B_2O_3$ | 3 | 2 | 3 | 3 | 3 |
| MgO | — | — | — | — | 1 |

It is found necessary that buffer layer 12 is formed of material having a coefficient of thermal expansion compatible with dielectric layer 16 so that after the unit is subsequently fired, no excessive stresses are induced in the structure whereby the electrical properties of the capacitor are affected or where cracks develop in the structure preventing a hermetically sealed capacitor. For these reasons the same material that is used for the dielectric layer is preferred for the buffer layer 12. The buffer layer, therefore, is also applied as a viscous mixture or paste, and is at least partly crystallizable.

Figure 4:
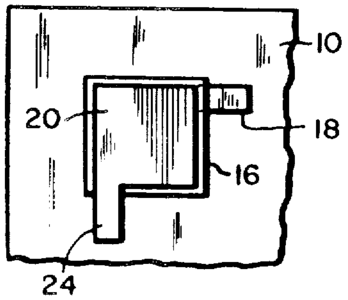

A second capacitor plate 20, as illustrated in FIG. 4, is applied in the same manner as plate 14. Suitable plate materials are gold, silver, platinum, and palladium. The unit so formed is then fired to volatilize the organic constituents and to at least begin crystallization of the first buffer and dielectric layers.

Figure 5:
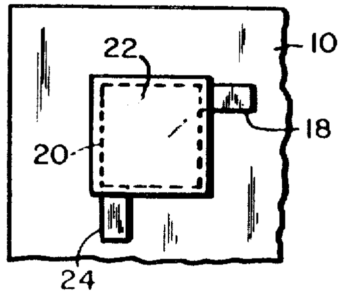
Figure 6:
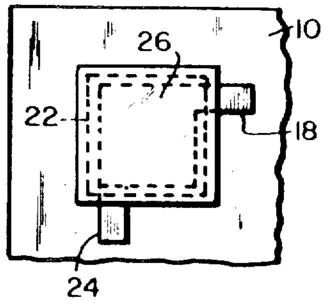

Referring now to FIG. 5, a second buffer layer 22 is applied over the exposed surface of plate 20 in such a manner that only plate terminals 18 and 24 of plates 14 and 20 respectively are exposed. The second buffer layer is applied to form a transition between the capacitor unit and vitreous glaze 26, illustrated in FIG. 6. Glaze 26 is applied as a viscous mixture or paste of fritted vitreous material and an organic binder such as pine oil, or oil of lavender, for example. The glaze provides an impervious coating that hermetically seals the capacitor in a manner readily understood by one familiar with the art. Only capacitor plate terminals 18 and 24 extend beyond the Only Second buffer layer 22 is formed of material that is at least partly crystallizable and is chemically compatible with both the capacitor plate and glaze materials. The same material used for the buffer layer 12 and dielectric layer 16 is suitable for buffer layer 22. Materials suitable as glaze materials are illustrated in table II.

TABLE II

| | 1 | 2 |
|---|---|---|
| $SiO_2$ | 30 | 38 |
| $Al_2O_3$ | 10 | 7 |
| $B_2O_3$ | 20 | 20 |
| PbO | 40 | 35 |

The unit is then fired again to volatilize the remaining organic constituents and to complete crystallization of the layers in which crystallization was started by the earlier firing and to crystallize the second buffer layer to the extent that these layers are crystallizable.

As described, the various buffer layers, capacitor plates, dielectric layer, and glaze covering are applied as a viscous mixture or paste. Suitable methods for applying these layers are silk screening, spraying, knife casting, use of a pressure-sensitive tape, or other similar methods well known to one familiar with the art.

It has been found that a buffer layer, between the substrate and the first capacitor plate, formed of material that has a coefficient of thermal expansion compatible with that of the dielectric layer sufficiently reduces the stresses induced in the capacitor unit making it nonpolar and reduces the sensitivity of the capacitance thereof upon voltage change. By applying a buffer layer between the second capacitor plate and the glaze material of material that is at least partly crystallizable and otherwise chemically compatible with both the plate and glaze materials, results in a capacitor having electrically sound capacitor plates. If a glaze were applied directly to the metallic capacitor plate, the glaze would be molten during firing causing the plate metal to go into solution, be floated, or otherwise combine with the glaze material resulting in a defective capacitor having a wholly unpredictable capacitance. By employing a buffer material that is crystallizable, the buffer layer is molten for a very short period of time thereby reducing the time during which the metal may go into solution, be floated, or otherwise combine with the adjoining materials.

In addition, it has been found that by firing the unit after the second plate is applied not only permits the organic constituents of the earlier applied layers to be volatilized more readily, but also permits the plates to be fused to the first buffer layer and to the dielectric, and the plate terminals to be fused to the substrate before the second buffer layer and glaze material are applied, thereby still further reducing the possibility of the plate and terminal materials to be floated.

Figure 7:
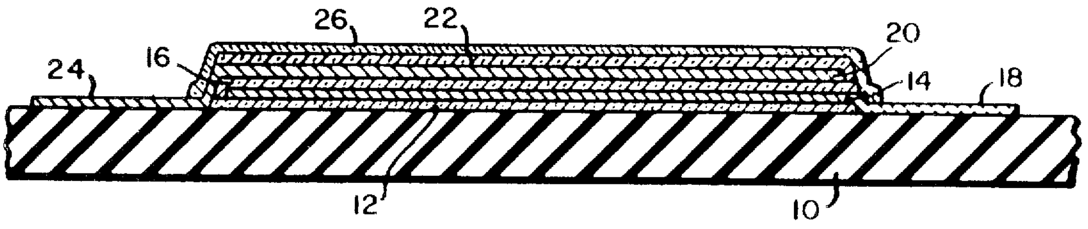
FIG. 7 is a cross-sectional elevation of a capacitor formed in accordance with this invention.

FIG. 7 illustrates a hermetically sealed, nonpolar capacitor formed in accordance with the present invention and one which is suitable for integrating into a microcircuit. Only the capacitor terminals extend beyond the glaze material.

A typical example of the present invention is illustrated by the following. A glazed alumina substrate having a thickness of about 0.030 inch suitable for forming a microcircuit thereon was provided. A first viscous mixture or paste was prepared by mixing 70 percent by weight of finely divided crystallizable glass of the type shown in example 1 of table I hereof, having a size of up to about 10 microns (1 micron equals 0.001 mm.) and 30 percent by weight of pine oil vehicle to moisten the glass particles for silk screening. The capacitor plate material was prepared by mixing about 70 percent by weight of finely divided gold having a size of about 1 micron or less with about 30 percent by weight of pine oil vehicle to form a second viscous mixture. The glaze coating mixture was prepared by mixing 70 percent by weight of glass particles of the type shown in example 1 of table II hereof, having a size which will pass through a 100-mesh screen, and 30 percent by weight of pine oil to form a third viscous mixture.

A first buffer layer of the first viscous mixture was silk screened through a 152-mesh screen onto the alumina substrate with the layer having a size somewhat larger than that of the ultimate capacitor plates. A first capacitor plate of the second viscous mixture was then silk screened through a 380-mesh screen over the buffer layer so that only a terminal for the plate extended beyond the buffer layer. A dielectric layer of the first viscous mixture was then silk screened through the 152-mesh screen over the plate covering all of it but the terminal, followed by a second capacitor plate which was silk screened through the 380-mesh screen over the dielectric layer. Only the terminals of the two plates extended beyond the dielectric layer.

The unit so formed was placed in a furnace and fired for 3½ minutes at 925° C. to volatilize the organic constituents and to at least begin crystallization of the buffer and dielectric layers. After the article was cooled a second buffer layer was applied over the exposed surface of the second capacitor plate. This layer was of the same material and was applied in the same manner as the first buffer layer. A coating of the prepared glaze material was then silk screened through a 83-mesh screen over the entire unit permitting only the capacitor plate terminals to extend beyond. The article was then fired for 12 minutes at 925° C. to volatilize the organic constituents of the last layers applied and to complete the crystallization of the first buffer and dielectric layers and to crystallize the second buffer layer to the extent that these layers were crystallizable. The glass coating fused forming a hermetically sealed capacitor. The fired article had a buffer layer between the first capacitor plate and the substrate of approximately 0.0005 inch thick and a coefficient of thermal expansion of approximately $80\times10^{17}$ per °C. which precisely matched the coefficient of thermal expansion of the dielectric layer which had a thickness of about 0.001 inch. The capacitance value of the resulting capacitor was about 100 pf. It was found that the capacitance value was independent of the polarity of the electrical energy applied to the capacitor terminals and the sensitivity of the capacitance upon voltage change was low.

Although the present invention has been described with respect to specific details of certain embodiments thereof, it is not intended that such details be limitations upon the scope of the invention except insofar as set forth in the following claims.

We claim:

1. In the method of manufacturing capacitors the steps of
providing a nonconductive substrate,
applying a buffer layer of a viscous mixture of finely divided crystallizable vitreous material and an organic vehicle to said substrate,
applying to said buffer layer in the order named a first capacitor plate, a dielectric layer, and a second capacitor plate, said dielectric layer comprising a mixture of finely divided crystallizable vitreous material and an organic vehicle, said first and second capacitor plates comprising a mixture of finely divided metal and an organic vehicle, a portion of each of said plates extending beyond the edge of said dielectric layer to form terminals for said plates, the buffer layer material having a coefficient of thermal expansion compatible with that of said dielectric layer,
firing the unit so formed to volatilize the organic constituents, fuse adjoining layers and plates to each other and to the adjoining portions of said substrate, and at least partly crystallize the buffer and dielectric layers thereafter
applying a second buffer layer of a viscous mixture of finely divided crystallizable vitreous material and an organic vehicle to the exposed surface of said second capacitor plate,
applying a layer of a mixture of finely divided vitreous glazing material and an organic vehicle to the capacitor so formed thereby enclosing it, said terminals extending beyond the glazing material, and
refiring the unit so formed to volatilize the organic constituents, to complete crystallization of the first buffer and dielectric layers, to crystallize the second buffer layer, and to fuse the newly applied layers to adjoining layers, to the adjoining exposed surface of said second capacitor plate, and to the adjoining portions of said substrate.

2. A method of manufacturing an electrical capacitor comprising the steps of
providing a nonconductive substrate,
applying a first buffer layer comprising a frit of finely divided crystallizable vitreous material to said substrate,
applying to said first buffer layer a first capacitor plate of finely divided metal,
applying to said first capacitor plate a dielectric layer comprising a frit of finely divided crystallizable vitreous material, the buffer layer material having a coefficient of thermal expansion compatible with that of said dielectric layer,
applying a second capacitor plate of finely divided metal to said dielectric layer, a portion of each of said plates extending beyond the dielectric layer to form terminals for said plates,
firing the unit so formed to fuse adjoining layers, and plates to each other and to the adjoining portions of said substrate, and at least partly crystallize the buffer and dielectric layers, applying a second buffer layer comprising a frit of finely divided crystallizable vitreous material to the exposed surface of said second capacitor plate, applying a layer of vitreous glazing material to the capacitor so formed thereby enclosing it, said terminals extending beyond the glazing material, and thereafter firing the unit so formed to hermetically seal the capacitor, to complete crystallization of the dielectric and first buffer layers, to crystallize the second buffer layer, and to fuse the newly applied layers to adjoining layers, to the adjoining exposed surface of said second capacitor plate, and to the adjoining portions of said substrate.

3. A method of manufacturing capacitors comprising the steps of providing an alumina substrate, applying to said substrate in the order named a first buffer layer, a first capacitor plate, a dielectric layer and second capacitor plate, said first buffer layer and dielectric layer comprising a viscous mixture of finely divided crystallizable vitreous material and an organic vehicle, said capacitor plates comprising a viscous mixture of finely divided metal selected from the group consisting of gold, silver, platinum and palladium, and an organic vehicle, firing the unit so formed to volatilize the organic constituents, fuse adjoining layers and plates to each other and to the adjoining portions of said substrate, and at least partly crystallize the first buffer and dielectric layers, applying to the exposed surface of said second capacitor plate in the order named a second buffer layer comprising a viscous mixture of finely divided crystallizable vitreous material and an organic vehicle, and a layer of a mixture of vitreous glazing material and organic vehicle, and thereafter firing the unit so formed to volatilize the organic constituents, complete crystallization of the first buffer and dielectric layers, to crystallize the second buffer layer, and to fuse the newly applied layers to adjoining layers, to the adjoining exposed surface of said second capacitor plate, and to the adjoining portions of said substrate.

4. In the method of manufacturing an electrical capacitor applied to a nonconductive substrate comprising a dielectric layer sandwiched between a pair of plates and a vitreous glaze covering, the improvement comprising firing the unit before the glaze is applied to fuse the adjoining layer and plates to each other and to the adjoining portions of said substrate, and thereafter applying a glaze frit and refiring the article to fuse the glaze to the previously fired unit thereby hermetically encapsulating the capacitor.

* * * * *

PO-1050
(5/69)

UNITED STATES PATENT OFFICE
CERTIFICATE OF CORRECTION

Patent No. 3,615,981 Dated October 26, 1971

Inventor(s) C. R. Pratt-S. G. Stalnecker-W. H. Tarcza

It is certified that error appears in the above-identified patent and that said Letters Patent are hereby corrected as shown below:

| PATENT | APPLICATION |
|---|---|
| Column 2, line 45, delete "Only" and instead insert -- glaze --. | Page 4, line 20 |
| Column 4, line 8, "80 x $10^{17}$" should be -- 80 x $10^{-7}$ --. | Page 7, line 26 |

Signed and sealed this 18th day of April 1972.

(SEAL)
Attest:

EDWARD M.FLETCHER,JR.
Attesting Officer

ROBERT GOTTSCHALK
Commissioner of Patents